US009748240B2

(12) United States Patent
Utsumi

(10) Patent No.: US 9,748,240 B2

(45) Date of Patent: Aug. 29, 2017

(54) SEMICONDUCTOR DEVICE INCLUDING A BOUNDARY OF CONDUCTIVITY IN A SUBSTRATE

(71) Applicant: Toshiba Memory Corporation, Minato-ku (JP)

(72) Inventor: Tetsuaki Utsumi, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/045,501

(22) Filed: Feb. 17, 2016

(65) Prior Publication Data

US 2016/0372418 A1 Dec. 22, 2016

Related U.S. Application Data

(60) Provisional application No. 62/182,781, filed on Jun. 22, 2015.

(51) Int. Cl.

*H01L 23/522* (2006.01)
*H01L 27/092* (2006.01)
*H01L 23/528* (2006.01)
*H01L 23/485* (2006.01)

(52) U.S. Cl.

CPC .......... *H01L 27/092* (2013.01); *H01L 23/485* (2013.01); *H01L 23/528* (2013.01)

(58) Field of Classification Search

CPC . H01L 23/5226; H01L 23/528; H01L 27/092; H01L 23/522; H01L 23/485

USPC .................................................. 257/390, 774

See application file for complete search history.

(56) References Cited

U.S. PATENT DOCUMENTS 8,284,583 B2 10/2012 Takahashi
2013/0084684 A1* 4/2013 Ishii .................. H01L 21/28282 438/257
2014/0177312 A1* 6/2014 Shibata ............... H01L 27/0207 365/72

FOREIGN PATENT DOCUMENTS

JP 2007-81193 3/2007
JP 2010-40903 2/2010
JP 2010-135658 6/2010

* cited by examiner

*Primary Examiner* — Alexander Oscar Williams

(74) *Attorney, Agent, or Firm* — Oblon, McClelland, Maier & Neustadt, L.L.P.

(57) ABSTRACT

A device includes first and second semiconductor-regions located in a substrate which are adjacent to each other at a boundary. First contacts are located in the first semiconductor-region along the boundary and are electrically connected to the first semiconductor-region. Second contacts are located in the second semiconductor-region along the boundary and are electrically connected to the second semiconductor-region. The second contacts are not located in parts of the second semiconductor-region on an opposite side to the first contacts across the boundary. The parts of the second semiconductor-region are adjacent to the first contacts in a first direction s perpendicular to an arranging direction of the first and second contacts. The first contacts are not located in parts of the first semiconductor-region on an opposite side to the second contacts across the boundary. The parts of the first semiconductor-region are adjacent to second contacts in the first direction.

19 Claims, 6 Drawing Sheets

40 70 CG2 CW1 CS1 CG1 CD2 G1 SG CD1 CS2 60 G2 65 65 65 D2 S2 51 S1 D1 D1 10 20 20 12(P_well) (22) 41 11(N_well) (21)

SEMICONDUCTOR DEVICE INCLUDING A BOUNDARY OF CONDUCTIVITY IN A SUBSTRATE

CROSS REFERENCE TO RELATED APPLICATIONS

This application is based upon and claims the benefit of priority from the prior U.S. Provisional Application No. 62/182,781 filed on Jun. 22, 2015, the entire contents of which are incorporated herein by reference.

FIELD

The embodiments of the present invention relate to a semiconductor device.

BACKGROUND

In a semiconductor integrated circuit to be used for a sense amplifier of a semiconductor storage device or the like, a P-type semiconductor region and an N-type semiconductor region are sometimes located to be adjacent in parallel to each other on a surface of a semiconductor substrate. For example, N-MOS (Metal-Oxide-Semiconductor) transistors are provided in the P-type semiconductor region and P-MOS transistors are provided in the N-type semiconductor region. In some cases, substrate bias contacts are provided in the P-type semiconductor region and the N-type semiconductor region along a boundary between these semiconductor regions to apply a substrate bias potential to the N-MOS transistors or the P-MOS transistors.

The substrate bias contacts are arranged to apply a sufficient substrate bias potential to all the transistors. Therefore, a sufficient number of the substrate bias contacts need to be arranged for each of the P-type semiconductor region and the N-type semiconductor region in a sufficient range with respect to each of the semiconductor regions. Accordingly, when the substrate bias contacts are arranged in a boundary portion between the P-type semiconductor region and the N-type semiconductor region, the width of a space between transistors placed across the boundary portion needs to be large to ensure a place for the substrate bias contacts, which leads to an increase in the semiconductor chip area and an increase in the manufacturing cost.

DETAILED DESCRIPTION

Embodiments will now be explained with reference to the accompanying drawings. The present invention is not limited to the embodiments.

A semiconductor device according to an embodiment comprises a semiconductor substrate. A first semiconductor region of a first conductivity type is located in the semiconductor substrate. A second semiconductor region of a second conductivity type is located in the semiconductor substrate and is adjacent to the first semiconductor region at a boundary. A plurality of first contacts are located in the first semiconductor region along the boundary and are electrically connected to the first semiconductor region. A plurality of second contacts are located in the second semiconductor region along the boundary and are electrically connected to the second semiconductor region. The second contacts are not located in parts of the second semiconductor region on an opposite side to the first contacts across the boundary. The parts of the second semiconductor region are adjacent to the first contacts in a first direction substantially perpendicular to an arranging direction of the first and second contacts. The first contacts are not located in parts of the first semiconductor region on an opposite side to the second contacts across the boundary. The parts of the first semiconductor region are adjacent to second contacts in the first direction.

Figure 1:
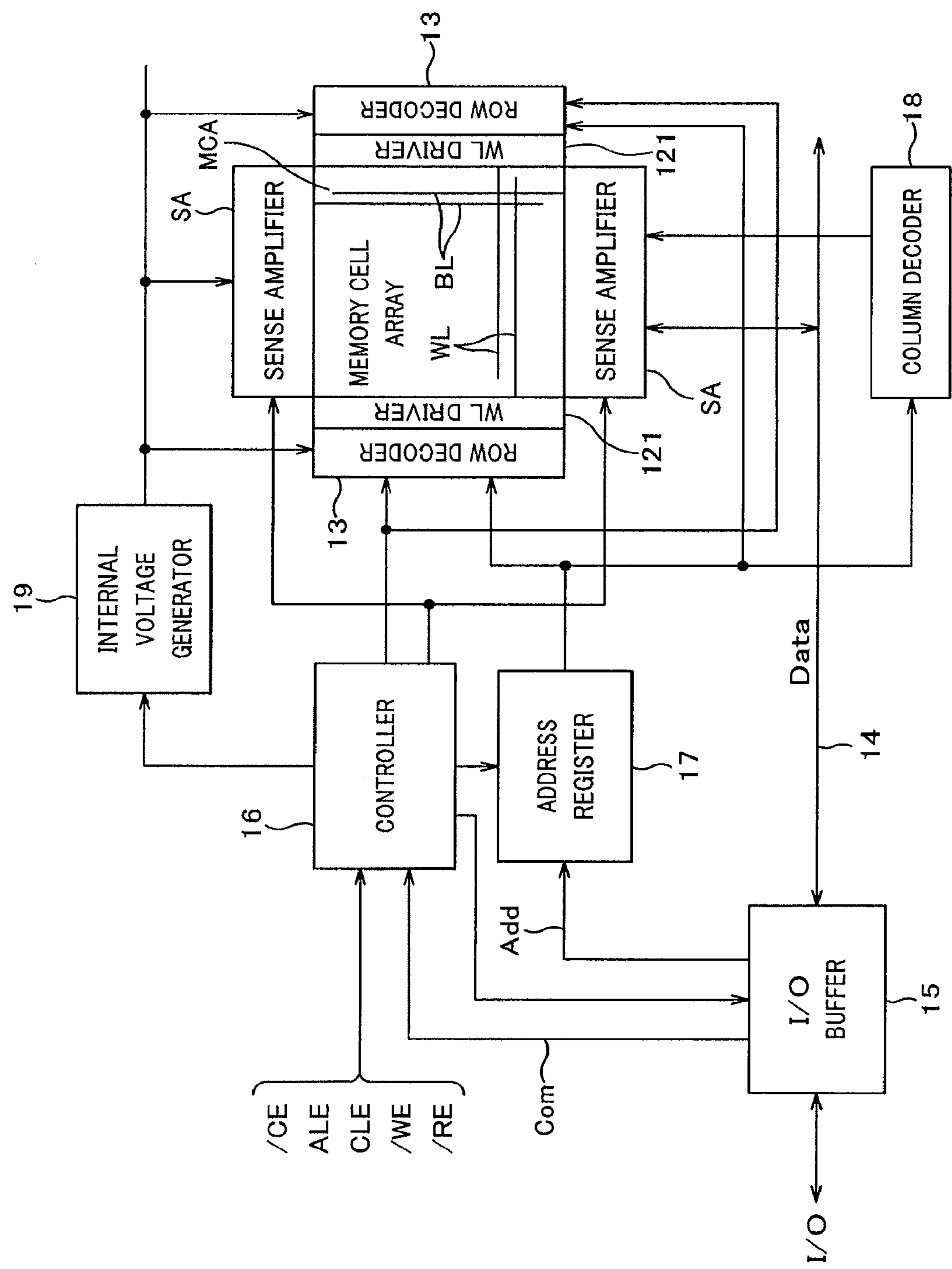
FIG. 1 is a block diagram showing a configuration of a NAND EEPROM according to one embodiment.

FIG. 1 is a block diagram showing a configuration of a NAND EEPROM (Electrically Erasable Programmable Read-Only Memory) according to one embodiment. A memory cell array MCA can be a plane-type memory cell array in which a plurality of memory cells are arrayed two-dimensionally in a matrix or a stack-type memory cell array in which a plurality of memory cells are arrayed three-dimensionally.

Gates of the memory cells are connected to word lines WL, respectively, and sources or drains of the memory cells are connected to bit lines BL, respectively. The word lines WL are arranged in a row direction and the bit lines BL are arranged in a column direction to intersect with each other.

A sense amplifier SA is placed at one end of the memory cell array MCA in a bit line direction. A sense amplifier SA is placed also at the other end of the memory cell array MCA opposite to the one end of the memory cell array MCA in the bit line direction. The sense amplifiers SA are connected to the bit lines BL and cause a cell current to flow in a memory cell connected to a select word line WL via the corresponding bit line BL. The sense amplifiers SA detect a cell current, thereby detecting data stored in a memory cell.

A row decoder 13 and a word line driver 121 are placed at either end of the memory cell array MCA in a word line direction. The word line drivers 121 are connected to the word lines WL and are configured to apply a voltage to a word line WL when data is to be written to a memory cell.

In the NAND EEPROM, a plurality of the memory cells are connected in series to constitute a NAND string. One end of the NAND string is connected to a bit line BL via a select transistor (not shown) and the other end thereof is connected to a source (not shown) via a select transistor.

Data transmission and reception between the sense amplifiers SA and an external input/output terminal I/O is performed via a data bus 14 and an I/O buffer 15.

Various external control signals such as a chip enable signal /CE, an address-latch enable signal ALE, a command-latch enable signal CLE, a write enable signal /WE, and a read enable signal /RE are input to a controller 16. The controller 16 discriminates an address Add and a command Com supplied from the input/output terminal I/O based on these control signals. The controller 16 transfers the address Add to the row decoder 13 and a column decoder 18 via an address register 17. The controller 16 decodes the command Corn. The sense amplifiers SA are configured to be capable of applying a voltage to the bit lines BL according to a column address decoded by the column decoder 18. The word line driver 121 is configured to be capable of applying a voltage to the word lines WL according to a row address decoded by the row decoder 13.

The controller 16 performs sequence control operations of reading, writing, and erasing data according to the external control signals and the command. An internal-voltage generation circuit 19 is provided to generate internal voltages (a voltage stepped-up or stepped-down from a power supply voltage, for example) necessary for the respective operations. The internal-voltage generation circuit 19 also is controlled by the controller 16 and performs a voltage step-up operation or a voltage step-down operation to generate a necessary voltage.

Figure 2:
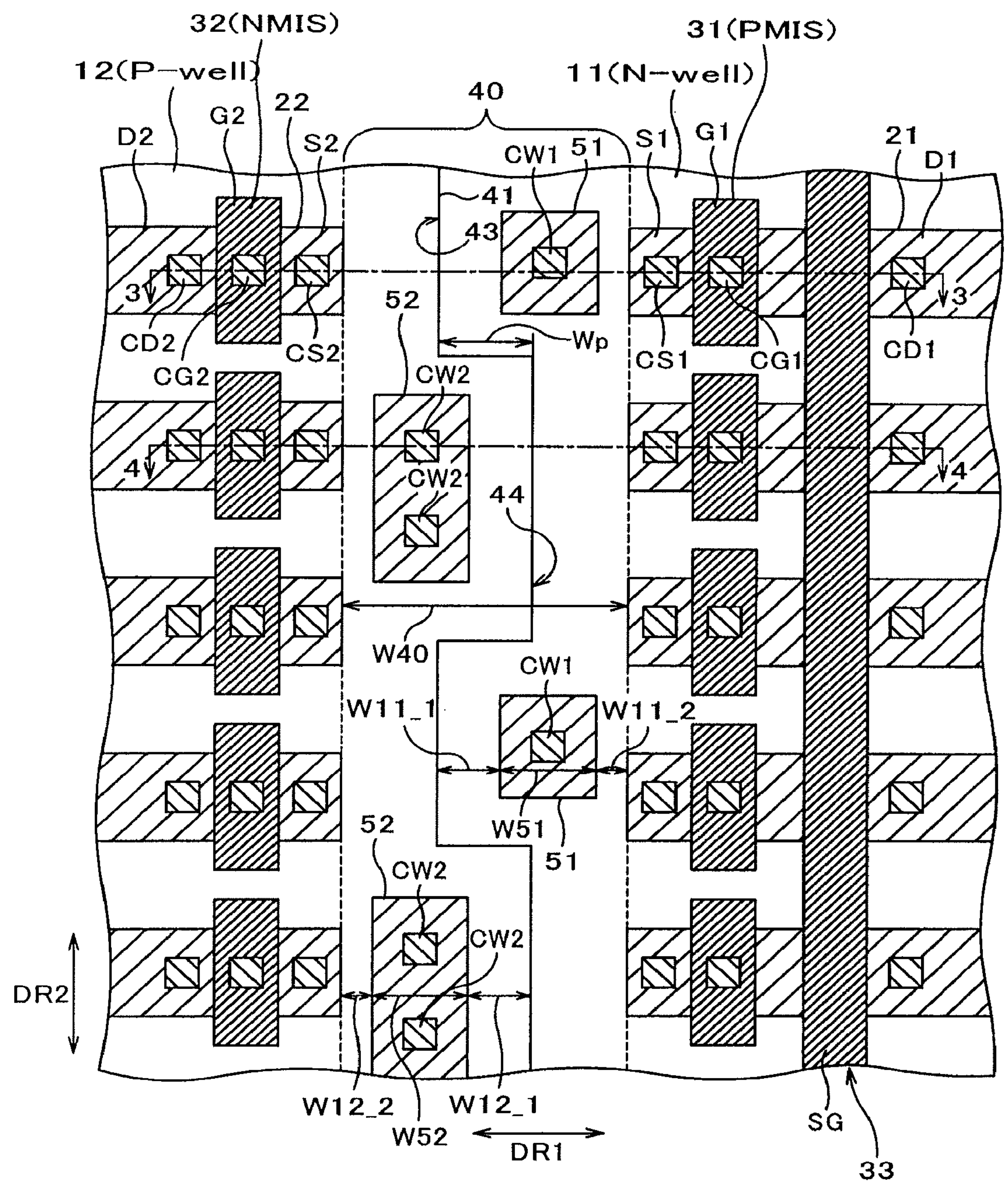
FIG. 2 is a layout plan view showing an example of a configuration of the sense amplifiers SA according to the present embodiment.

FIG. 2 is a layout plan view showing an example of a configuration of the sense amplifiers SA according to the present embodiment. While applied to the sense amplifiers SA of the NAND EEPROM, the present embodiment is applicable also to any other CMOS semiconductor devices having both an N-type semiconductor region and a P-type semiconductor region.

The sense amplifier SA includes an N-well diffusion layer 11, a P-well diffusion layer 12, active areas 21 and 22, P-transistors 31, N-transistors 32, N-well contact diffusion layers 51, P-well contact diffusion layers 52, N-well contacts CW1, and P-well contacts CW2.

The N-well diffusion layer 11 serving as a first semiconductor region is formed in a semiconductor substrate (reference numeral 10 in FIGS. 3 and 4) and is a diffusion layer containing N-type impurities (phosphorus or arsenic, for example). When an N-type semiconductor substrate is used, the first semiconductor region can be the N-type semiconductor substrate itself rather than the N-well diffusion layer 11.

The P-well diffusion layer 12 serving as a second semiconductor region is formed in the semiconductor substrate and is a diffusion layer containing P-type impurities (boron, for example). The P-well diffusion layer 12 is adjacent to the N-well diffusion layer 11 at a boundary portion 40. When a P-type semiconductor substrate is used, the second semiconductor region can be the P-type semiconductor substrate itself rather than the P-well diffusion layer 12.

In a completed semiconductor device, the N-well diffusion layer 11 and the P-well diffusion layer 12 except for the active areas 21 and 22, the N-well contact diffusion layers 51, and the P-well contact diffusion layers 52 are covered with an element isolation region such as an STI (Shallow Trench Isolation) (not shown in FIG. 2). FIG. 2 thus shows a plan layout of the N-well diffusion layer 11 and the P-well diffusion layer 12 appearing when the element isolation region is removed.

The active areas 21 serving as a first element formation region are provided in the N-well diffusion layer 11 and can be parts of the N-well diffusion layer 11 isolated by the element isolation region. The active areas 21 extend in an adjacent direction DR1 in which the N-well diffusion layer 11 and the P-well diffusion layer 12 are adjacent to each other, and are arrayed in a perpendicular direction DR2 substantially perpendicular to the adjacent direction DR1. Semiconductor elements such as the P-transistors 31 are provided on the active areas 21.

The active areas 22 serving as a second element formation region are provided in the P-well diffusion layer 12 and can be parts of the P-well diffusion layer 12 isolated by the element isolation region. The active areas 22 extend in the adjacent direction DR1 described above and are arrayed in the perpendicular direction DR2 described above. Semiconductor elements such as the N-transistors 32 are provided on the active areas 22.

The P-transistors 31 are provided on the active areas 21 in the N-well diffusion layer 11. The transistors 31 each include a source layer S1, a drain layer D1, and a gate electrode G1. The source layer S1 is a P-type diffusion layer provided on the corresponding active area 21 and is electrically connected to a source contact CS1. The drain layer D1 is a P-type diffusion layer provided on the active area 21 and is electrically connected to a drain contact CD1. The gate electrode G1 is provided on the active area 21 (the N-well diffusion layer 11) with a gate dielectric film (not shown) interposed therebetween and is electrically insulated from the active area 21 (the N-well diffusion layer 11). The gate electrode G1 is electrically connected to a gate contact CG1

The N-transistors 32 are provided on the active areas 22 in the P-well diffusion layer 12. The transistors 32 each include a source layer S2, a drain layer D2, and a gate electrode G2. The source layer S2 is an N-type diffusion layer provided on the corresponding active area 22 and is electrically connected to a source contact CS2. The drain layer D2 is an N-type diffusion layer provided on the active area 22 and is electrically connected to a drain contact CD2. The gate electrode G2 is provided on the active area 22 (the P-well diffusion layer 12) with a gate dielectric film (not shown) interposed therebetween and is electrically insulated from the active area 22 (the P-well diffusion layer 12). The gate electrode G2 is electrically connected to a gate contact CG2. While channel length directions of the transistors 31 and 32 are the direction DR1 in the present embodiment, the channel length directions of the transistors 31 and 32 are not particularly limited.

The N-well contact diffusion layers 51 are N-type diffusion layers having an impurity concentration higher than that of the N-well diffusion layer 11. The N-well contact diffusion layers 51 are provided to lower a contact resistance between the N-well contacts CW1 and the N-well diffusion layer 11.

The P-well contact diffusion layers 52 are P-type diffusion layers having an impurity concentration higher than that of the P-well diffusion layer 12. The P-well contact diffusion layers 52 are provided to lower a contact resistance between the P-well contacts CW2 and the P-well diffusion layer 12.

The N-well contacts CW1 serving as first contacts are provided on the N-well contact diffusion layers 51 and are electrically connected to the N-well diffusion layer 11. The N-well contacts CW1 are provided at the boundary portion 40 between the N-well diffusion layer 11 and the P-well diffusion layer 12. When viewed from above the semiconductor substrate, the N-well contacts CW1 are arranged on the surface of the semiconductor substrate in predetermined intervals in the direction DR2 along a boundary 41 between the N-well diffusion layer 11 and the P-well diffusion layer 12.

The N-wellcontacts CW1 are well bias contacts provided to apply a well bias voltage to the N-well diffusion layer 11. The well bias voltage to be applied to the N-well diffusion layer 11 is a voltage applied to the entire N-well diffusion layer 11 and is a voltage used as a reference when the P-transistors 31 are operated or a voltage for operating the P-transistors 31. Therefore, the N-well contacts CW1 are electrically connected with a common wire (not shown) and are controlled at almost equal potentials except for potential variations due to parasitic resistances and the like. When the first semiconductor region is an N-type semiconductor substrate, the N-well contacts CW1 are substrate bias contacts used to apply a substrate bias voltage to the N-well diffusion layer 11. The substrate bias voltage to be applied to the N-well diffusion layer 11 is also a voltage applied to the entire N-well diffusion layer 11.

The P-well contacts CW2 serving as second contacts are provided on the P-well contact diffusion layers 52 and are electrically connected to the P-well diffusion layer 12. The P-well contacts CW2 are provided at the boundary portion 40. When viewed from above the semiconductor substrate, the P-well contacts CW2 are arranged on the surface of the semiconductor substrate in predetermined intervals in the direction DR2 along the boundary 41.

The P-well contacts CW2 are well bias contacts provided to apply a well bias voltage to the P-well diffusion layer 12. The well bias voltage to be applied to the P-well diffusion layer 12 is a voltage applied to the entire P-well diffusion layer 12 and is a voltage used as a reference when the N-transistors 32 are operated or a voltage for operating the N-transistors 32. Therefore, the P-well contacts CW2 are electrically connected with a common wire (not shown) and are controlled at almost equal potentials except for potential variations due to parasitic resistances and the like. When the second semiconductor region is a P-type semiconductor substrate, the P-well contacts CW2 are substrate bias contacts used to apply a substrate bias voltage to the P-well diffusion layer 12. The substrate bias voltage to be applied to the P-well diffusion layer 12 is also a voltage applied to the entire P-well diffusion layer 12.

When the transistors 31 (32) are placed adjacently, are connected in series with a diffusion layer, and there is no other connection relation in the diffusion layer, no source contact or no drain contact may be required for the diffusion layer. In such a diffusion layer, source contacts or drain contacts do not need to be provided.

The boundary portion 40 between the N-well diffusion layer 11 and the P-well diffusion layer 12 is a region in which no semiconductor element is provided between the active area 21 and the active area 22. That is, the boundary portion 40 is a region from an end of the active area 21 to an end of the active area 22 neighboring the end of the active area 21. The boundary portion 40 has the boundary 41 where the N-well diffusion layer 11 and the P-well diffusion layer 12 are in contact with each other. When viewed from above the semiconductor substrate, the boundary 41 has a concave-convex shape, a corrugated shape, or a zigzag shape on the surface of the semiconductor substrate as shown in FIG. 2.

The N-well contacts CW1 and the N-well contact diffusion layers 51 are provided to correspond to first convex portions 43 protruding toward the P-well diffusion layer 12 at the boundary portion 40. The P-well contacts CW2 and the P-well contact diffusion layers 52 are provided to correspond to second convex portions 44 protruding toward the N-well diffusion layer 11 at the boundary portion 40.

The N-well contacts CW1 and the N-well contact diffusion layers 51 are not adjacent to the P-well contacts CW2 and the P-well contact diffusion layers 52 in the direction DR1. The P-well contacts CW2 and the P-well contact diffusion layers 52 are also not adjacent to the N-well contacts CW1 and the N-well contact diffusion layers 51 in the direction DR1. On the surface of the semiconductor substrate, the N-well contacts CW1 are not provided on parts of the N-well diffusion layer 11 on the opposite side to the P-well contacts CW2 across the boundary 41. The P-well contacts CW2 are not provided on parts of the P-well diffusion layer 12 on the opposite side to the N-well contacts CW1 across the boundary 41. That is, when viewed from above the semiconductor substrate, the N-well contacts CW1 and the P-well contacts CW2 do not neighbor each other in the direction DR1 and are arranged alternately in the direction DR2 substantially perpendicular to the direction DR1 on the substrate of the semiconductor substrate. In other words, the N-well contacts CW1 and the P-well contacts CW2 are arranged in a staggered manner in the direction DR2. The N-well contact diffusion layers 51 and the P-well contact diffusion layers 52 also do not neighbor each other in the direction DR1 and are arranged alternately in the direction DR2. In other words, the N-well contact diffusion layers 51 and the P-well contact diffusion layers 52 are also arranged in a staggered manner in the direction DR2.

The N-well contacts CW1 and the P-well contacts CW2 are arranged on the surface of the semiconductor substrate alternately in the direction DR2 at a ratio of m (m is a natural number) to n (n is a natural number). That is, when the number of the N-well contacts CW1 provided on one N-well contact diffusion layer 51 is m and the number of the P-well contacts CW2 provided on one P-well contact diffusion layer 52 is n, the N-well contacts CW1 and the P-well contacts CW2 are provided alternately at the ratio of m:n. In the example shown in FIG. 2, m is 1 and n is 2. The N-well contacts CW1 and the P-well contacts CW2 can be thus provided alternatively at a ratio of 1:2. The number m of the N-well contacts CW1 provided on one N-well contact diffusion layer 51 and the number n of the P-well contacts CW2 provided on one P-well contact diffusion layer 52 are not particularly limited. To improve the yield or to reduce the contact resistance, m and n can be set to 2 or larger. The contact resistance to P-wells normally tends to be higher than that to N-wells. Therefore, it is preferable that the number n of the P-well contacts CW2 provided on one P-well contact diffusion layer 52 be larger than the number m of the N-well contacts CW1 provided on one N-well contact diffusion layer 51. Furthermore, the ratio of m to n does not always need to be constant over the boundary 41 and can change along the boundary 41. Accordingly, it suffices that a single P-well contact CW2 or a plurality of P-well contacts CW2 with respect to a single N-well contact CW1 or a plurality of N-well contacts CW1 are arranged on the surface of the semiconductor substrate alternately along the boundary 41.

A select transistor 33 is configured to be brought to a conduction state when the transistors 31 provided on the N-well diffusion layer 11 are to be selected. A select gate electrode SG of the select transistor 33 is provided in the same layer as the gate electrodes G1 and is provided on the active areas 21 (the N-well diffusion layer 11) with the gate dielectric film interposed therebetween similarly to the gate electrodes G1.

Figure 3:
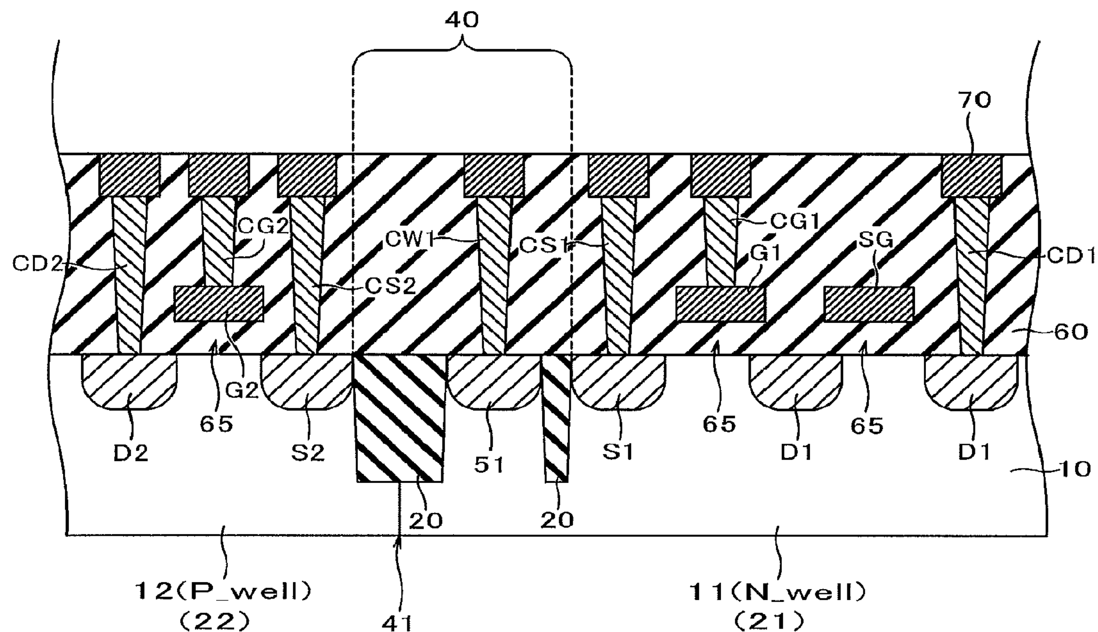
FIG. 3 is a cross-sectional view along a line 3-3 in FIG. 2.
Figure 4:
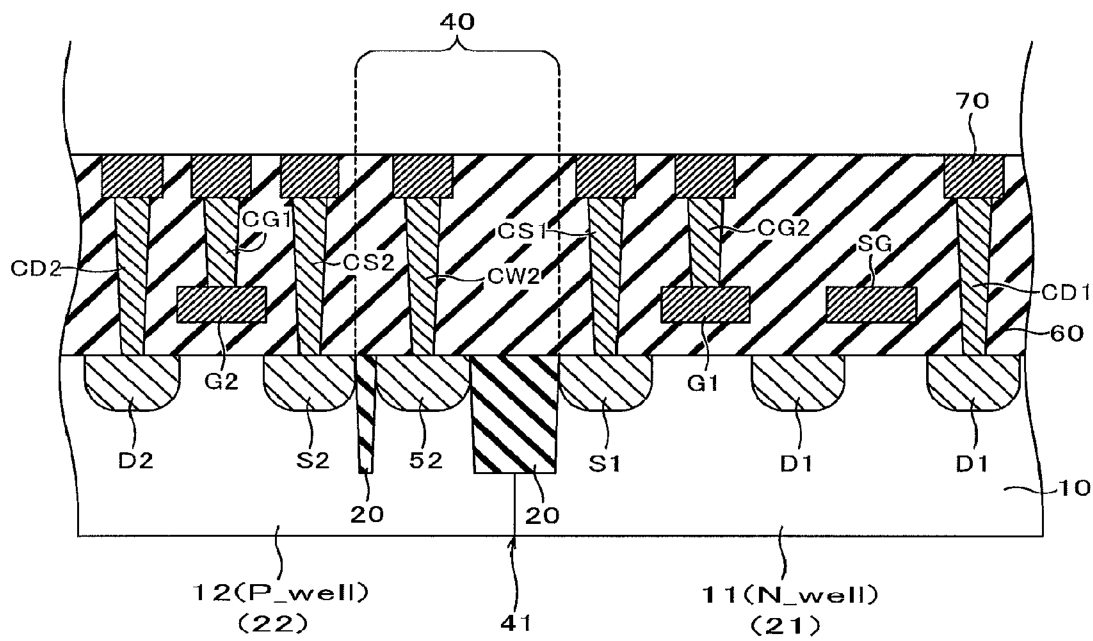
FIG. 4 is a cross-sectional view along a line 4-4 in FIG. 2.

FIG. 3 is a cross-sectional view along a line 3-3 in FIG. 2. FIG. 4 is a cross-sectional view along a line 4-4 in FIG. 2. In FIGS. 3 and 4, illustrations of a wiring layer, an interlayer dielectric film, and the like as layers upper than wires 70 are omitted.

The N-well diffusion layer 11 and the P-well diffusion layer 12 are provided in the semiconductor substrate 10. Element isolation regions 20 are provided at the boundary portion 40 and electrically isolate between the N-well diffusion layer 11 and the P-well diffusion layer 12. The element isolation regions 20 electrically isolate also between the active areas 21 and between the active areas 22. That is, regions of the well diffusion layers 11 and 12 other than the element isolation regions 20 are the active areas 21 and 22 and the well contact diffusion layers 51 and 52.

The source layers S1 and the drain layers D1 are provided on the active areas 21 of the N-well diffusion layer 11, and the source layers S2 and the drain layers D2 are provided on the active areas 22 of the P-well diffusion layer 12. The N-well contact diffusion layers 51 and the P-well contact diffusion layers 52 are provided between the element isolation regions 20 at the boundary portion 40.

A gate dielectric film 65 is provided on the semiconductor substrate 10 and the gate electrodes G1 and G2 and the select gate electrode SG are provided on the gate dielectric film 65.

Contacts CS1, CS2, CD1, CD2, CG1, CG2, CW1, and CW2 are provided in an interlayer dielectric film 60. The source contacts CS1 and CS2 are electrically connected to the source layers S1 and S2, respectively. The drain contacts CD1 and CD2 are electrically connected to the drain layers D1 and D2, respectively. The gate contacts CG1 and CG2 are electrically connected to the gate electrodes G1 and G2, respectively. The N-well contacts CW1 are electrically connected to the N-well contact diffusion layers 51. The P-well contacts CW2 are electrically connected to the P-well contact diffusion layers 52.

The contacts CS1, CS2, CD1, CD2, CG1, CG2, CW1, and CW2 are electrically connected to other diffusion layers, other wires, or the like (not shown) with the wires 70 provided further thereon. The semiconductor device can thereby connect the transistors 31 and 32 to other elements or can apply arbitrary voltages to the diffusion layers S1, S2, D1, D2, G1, G2, 51 and 52 connected to the contacts CS1, CS2, CD1, CD2, CG1, CG2, CW1, and CW2 via the contacts. The select gate electrode SG extends in the direction DR2 in FIG. 2 and is electrically connected at an end to other wires.

The boundary (hereinafter, also "well boundary") 41 of wells shown in FIG. 3 corresponds to the first convex portions 43 that protrude toward the P-well diffusion layer 12 on the surface of the semiconductor substrate 10 when viewed from above the semiconductor substrate 10 as shown in FIG. 2. On the other hand, the well boundary 41 shown in FIG. 4 corresponds to the second convex portions 44 that protrude toward the N-well diffusion layer 11 on the surface of the semiconductor substrate 10 when viewed from above the semiconductor substrate 10 as shown in FIG. 2. Therefore, the well boundary 41 in FIG. 3 is shifted in the adjacent direction DR1 with respect to the well boundary 41 in FIG. 4.

As described above, in the semiconductor device according to the present embodiment, the well boundary 41 is provided in a concave-convex shape, a corrugated shape, or a zigzag shape at the boundary portion 40 between the N-well diffusion layer 11 and the P-well diffusion layer 12 on the surface of the semiconductor substrate 10 when viewed from above the semiconductor substrate 10. The shapes of the first convex portions 43 and the second convex portions 44 on the surface of the semiconductor substrate 10 can be substantially semi-rectangular as shown in FIG. 2 or can be rounded semi-rectangular, substantially semi-elliptical, substantially semicircular, or substantially serrated.

The N-well contacts CW1 and the P-well contacts CW2 are not adjacent to each other in the adjacent direction DR1.

Associated therewith, the N-well contact diffusion layers 51 and the P-well contact diffusion layers 52 are not adjacent to each other in the adjacent direction DR1. A width W40 of the boundary portion 40 in the direction DR1 shown in FIG. 2 can be thereby reduced as will be explained below. The width W40 of the boundary portion 40 is a width between the active areas 21 and the active areas 22.

For example, it is assumed that the width of the N-well contact diffusion layers 51 in the direction DR1 is W51 and the width of the P-well contact diffusion layers 52 in the direction DR1 is W52 as shown in FIG. 2. It is also assumed that the width between the well boundary 41 and the N-well contact diffusion layers 51 in the direction DR1 is W11_1 and the width between the active areas 21 and the N-well contact diffusion layers 51 in the direction DR1 is W11_2. It is assumed that the width between the well boundary 41 and the P-well contact diffusion layers 52 in the direction DR1 is W12_1 and the width between the active areas 22 and the P-well contact diffusion layers 52 in the direction DR1 is W12_2. The widths W11_1, W11_2, W12_1, and W12_2 are specified in advance in specifications to ensure the man ufacturability, the element isolation reliability, and the like.

In the present embodiment, the well boundary 41 has a concave-convex shape as shown in FIG. 2 and thus the width W40 of the boundary portion 40 is narrowed correspondingly. For example, when a protrusion width (or a recess width) of the well boundary 41 in the direction DR1 is Wp, the width W40 of the boundary portion 40 is reduced at least by Wp from the sum of W11_1, W11_2, W12_1, W12_2, W51, and W52. That is, the following expression 1 holds.

$$W40=W11\_1+W11\_2+W12\_1+W12\_2+W51+W52-Wp \quad \text{(Expression 1)}$$

Furthermore, when the width Wp of the first convex portions 43 and the second convex portions 44 in the direction DR1 on the surface of the semiconductor substrate 10 is equal to or larger than W11_1 (Wp≥W11_1), the following expression 2 holds.

$$W40\leq W11\_2+W12\_1+W12\_2+W51+W52 \quad \text{(Expression 2)}$$

When the width Wp of the first convex portions 43 and the second convex portions 44 in the direction DR1 on the surface of the semiconductor substrate 10 is equal to or larger than W12_1 (Wp≥W12_1), the following expression 3 holds.

$$W40\leq W11\_1+W11\_2+W12\_2+W51+W52 \quad \text{(Expression 3)}$$

As described above, while depending on the width Wp of the first convex portions 43 and the second convex portions 44 in the direction DR1, the width W40 of the boundary portion 40 is at least smaller than the sum of W11_1, W11_2, W12_1, W12_2, W51, and W52.

Figure 5:
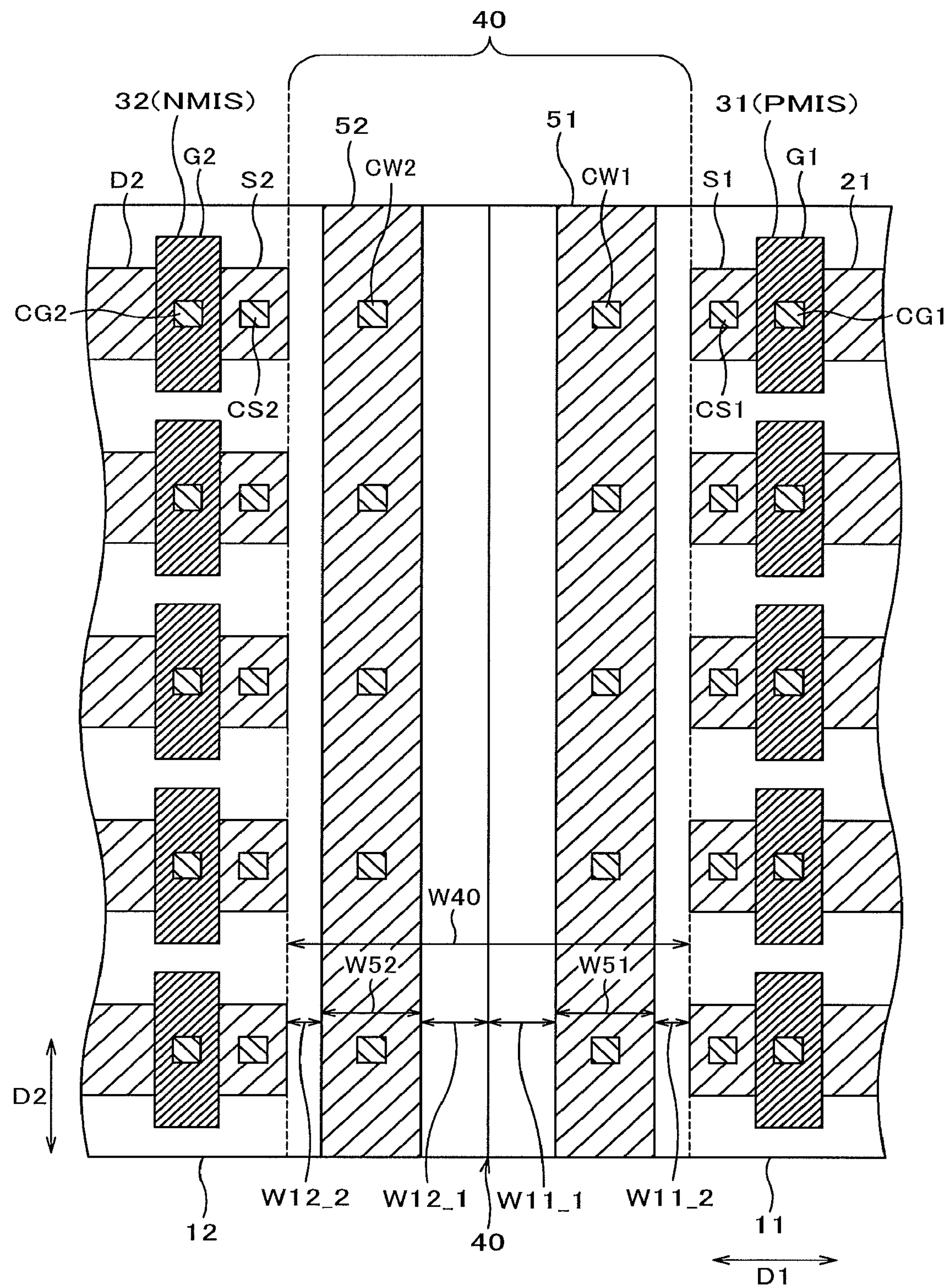
FIG. 5 is a layout plan view showing an example of a configuration of a sense amplifier in which the well boundary 41 is linear.

In contrast thereto, if the well boundary 41 is linear and the N-well contacts CW1 and the P-well contacts CW2 are adjacent in the direction DR2 as shown in FIG. 5, the width W40 of the boundary portion 40 is almost equal to the sum of W11_1, W11_2, W12_1, W12_2, W51, and W52. That is, the following expression 4 holds. FIG. 5 is a layout plan view showing an example of a configuration of a sense amplifier in which the well boundary 41 is linear.

$$W40=W11\_1+W11\_2+W12\_1+W12\_2+W51+W52 \quad \text{(Expression 4)}$$

Comparing the expressions 1 and 4 to each other, it is understood that the width W40 in a case where the well boundary 41 has a concave-convex shape is narrowed by the width Wp from the width W40 in a case where the well boundary 41 is linear. As described above, according to the present embodiment, the N-well contacts CW1 and the P-well contacts CW2 are not adjacent in the adjacent direction DR1 and the boundary portion 40 on the surface of the semiconductor substrate 10 has the boundary 41 in a concave-convex shape or a corrugated shape. The width W40 of the boundary portion 40 can be thereby narrowed. That is, the space width of the boundary portion 40 between the N-well diffusion layer 11 and the P-well diffusion layer 12 can be narrowed. As a result, the semiconductor chip area can be reduced and the manufacturing cost can be lowered.

(Modification)

Figure 6:
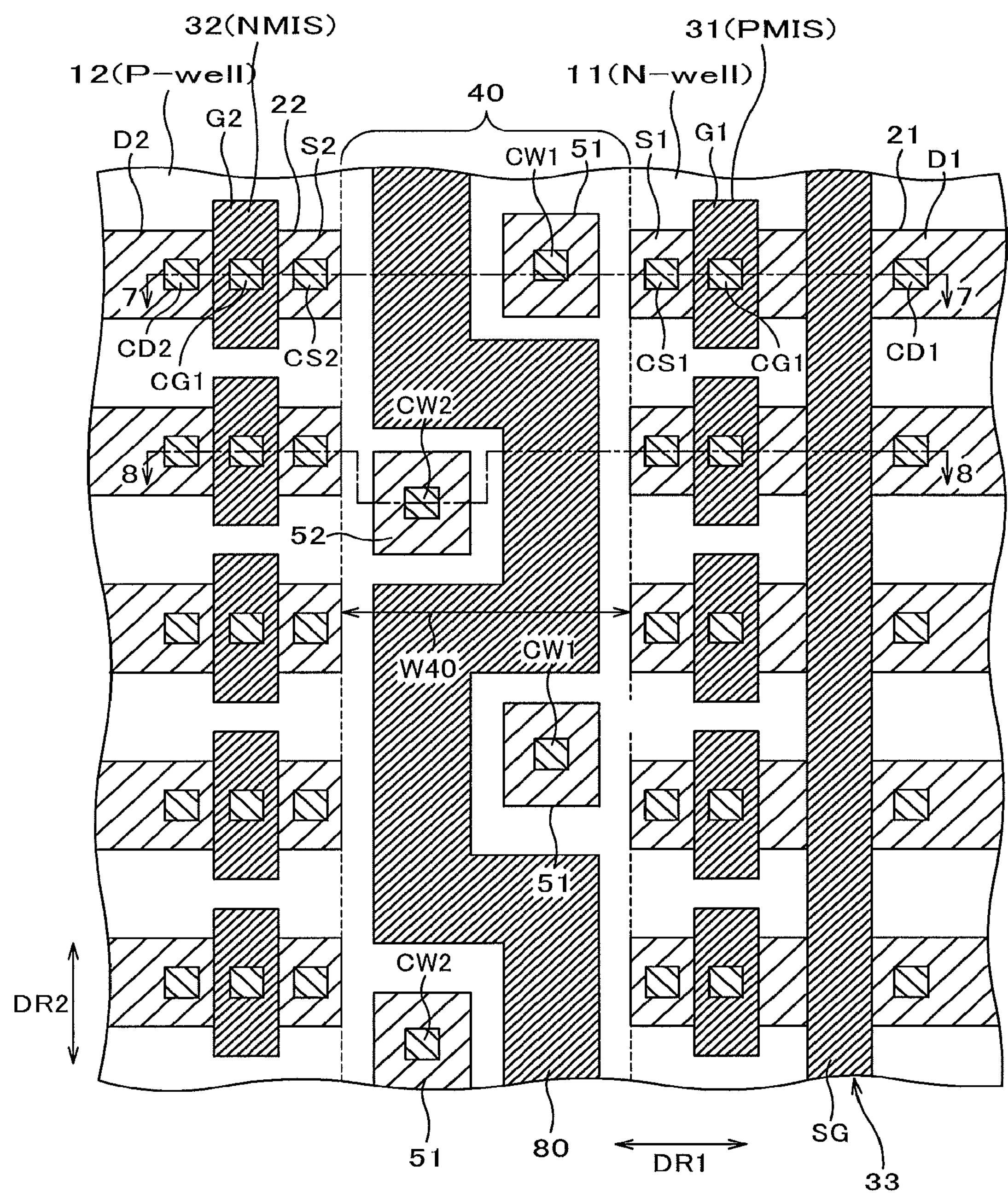
FIG. 6 is a layout plan view showing an example of a configuration of a semiconductor device according to a modification of the present embodiment.
Figure 7:
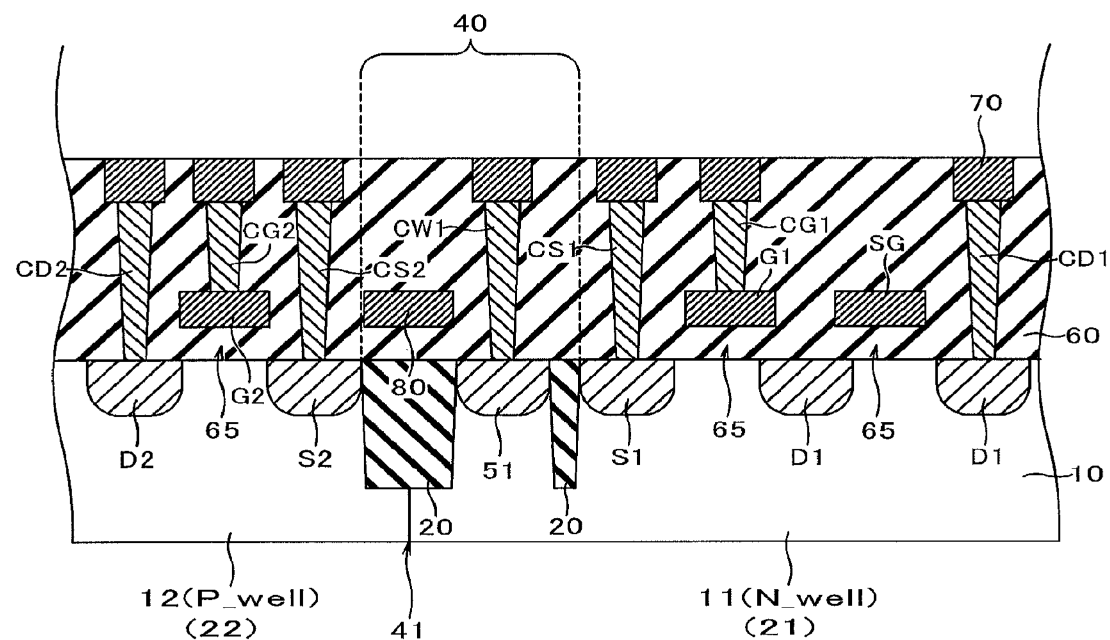
FIG. 7 is a cross-sectional view along a line 7-7 in FIG. 6.
Figure 8:
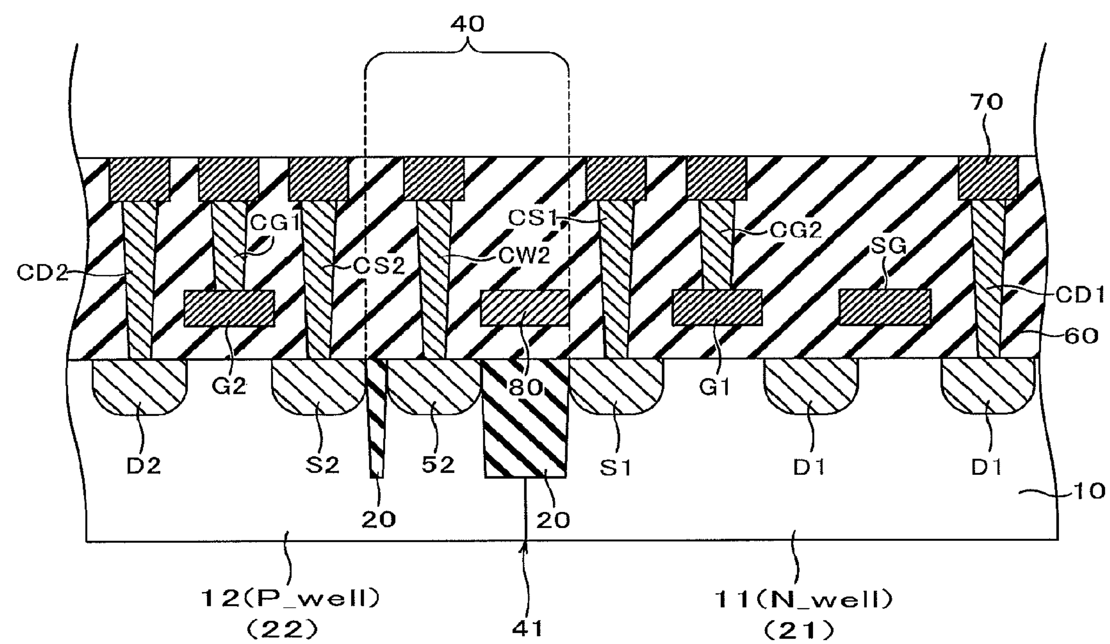
FIG. 8 is a cross-sectional view along a line 8-8 in FIG. 6.

FIG. 6 is a layout plan view showing an example of a configuration of a semiconductor device according to a modification of the present embodiment. FIG. 7 is a cross-sectional view along a line 7-7 in FIG. 6. FIG. 8 is a cross-sectional view along a line 8-8 in FIG. 6. The semiconductor device according to the present modification is different from that according to the embodiment described above in including a wire 80 above the well boundary 41 in the boundary portion 40. As shown in FIG. 6, the wire 80 has a concave-convex shape, a corrugated shape, or a zigzag shape when viewed from above the semiconductor substrate, similarly to the well boundary 41. As shown in FIGS. 7 and 8, the wire 80 is formed in the same layer as that of the gate electrodes G1 and G2 on the element isolation regions 20. Other configurations of the present modification can be identical to corresponding ones of the embodiment described above.

The wire 80 can be used as a power supply wire, a signal wire, or the like. The wire 80 can be a single wire or a plurality of wires arrayed substantially in parallel. Furthermore, the wire 80 can be electrically isolated from the well contacts CW1 and CW2 and the well contact diffusion layers 51 and 52. When used as a power supply wire, the wire 80 can be electrically connected to the well contacts CW1 and CW2, the well contact diffusion layers 51 and 52, and the like via other upper layer wires.

In this manner, as the wire 80 is laid along the well boundary 41, identical effects to those of the above embodiment can be achieved even when the wire 80 is provided above the well boundary 41 in the boundary portion 40.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:

a semiconductor substrate;

a first semiconductor region of a first conductivity type located in the semiconductor substrate;

a second semiconductor region of a second conductivity type located in the semiconductor substrate and adjacent to the first semiconductor region at a boundary;

a plurality of first contacts located in the first semiconductor region along the boundary and electrically connected to the first semiconductor region; and a plurality of second contacts located in the second semiconductor region along the boundary and electrically connected to the second semiconductor region, wherein the second contacts are not located in parts of the second semiconductor region on an opposite side to the first contacts across the boundary, the parts of the second semiconductor region being adjacent to the first contacts in a first direction substantially perpendicular to an arranging direction of the first and second contacts, and the first contacts are not located in parts of the first semiconductor region on an opposite side to the second contacts across the boundary, the parts of the first semiconductor region being adjacent to second contacts in the first direction.

2. The device of claim 1, wherein the boundary has a concave-convex shape, a corrugated shape, or a zigzag shape on a surface of the semiconductor substrate, the first contacts correspond to first convex portions protruding toward the second semiconductor region at the boundary, and the second contacts correspond to second convex portions protruding toward the first semiconductor region at the boundary.

3. The device of claim 1, wherein the first contacts and the second contacts are provided alternately along the boundary on a surface of the semiconductor substrate.

4. The device of claim 2, wherein the first contacts and the second contacts are provided alternately along the boundary on a surface of the semiconductor substrate.

5. The device of claim 1, wherein at least one of the second contacts are arranged with respect to at least one of the first contacts alternately along the boundary on a surface of the semiconductor substrate.

6. The device of claim 2, wherein at least one of the second contacts are arranged with respect to at least one of the first contacts alternately along the boundary on a surface of the semiconductor substrate.

7. The device of claim 1, wherein the first and second semiconductor regions are the semiconductor substrate or well diffusion layers, and the first and second contacts are substrate bias contacts or well bias contacts are used to apply a voltage to the semiconductor substrate or the well diffusion layers.

8. The device of claim 1, further comprising:

a first diffusion layer located in the semiconductor substrate and electrically connected to the first contacts;

a second diffusion layer located in the semiconductor substrate and electrically connected to the second contacts;

a first element formation region located in the first semiconductor region; and a second element formation region located in the second semiconductor region, wherein a width between the first element formation region and the second element formation region on a surface of the semiconductor substrate is smaller than a sum of a width between the first diffusion layer and the first element formation region, a width of the first diffusion layer, a width between the first diffusion layer and the second semiconductor region, a width between the second diffusion layer and the first semiconductor region, a width of the second diffusion layer, and a width between the second diffusion layer and the second element formation region.

9. The device of claim 8, wherein the width between the first element formation region and the second element formation region on a surface of the semiconductor substrate is equal to or smaller than a sum of the width between the first diffusion layer and the first element formation region, the width of the first diffusion layer, the width between the second diffusion layer and the first semiconductor region, the width of the second diffusion layer, and the width between the second diffusion layer and the second element formation region.

10. The device of claim 2, further comprising:

a first diffusion layer located in the semiconductor substrate and electrically connected to the first contacts;

a second diffusion layer located in the semiconductor substrate and electrically connected to the second contacts;

a first element formation region located in the first semiconductor region; and a second element formation region located in the second semiconductor region, wherein a width between the first element formation region and the second element formation region on a surface of the semiconductor substrate is smaller than a sum of a width between the first diffusion layer and the first element formation region, a width of the first diffusion layer, a width between the first diffusion layer and the second semiconductor region, a width between the second diffusion layer and the first semiconductor region, a width of the second diffusion layer, and a width between the second diffusion layer and the second element formation region.

11. The device of claim 10, wherein the width between the first element formation region and the second element formation region on a surface of the semiconductor substrate is equal to or smaller than a sum of the width between the first diffusion layer and the first element formation region, the width of the first diffusion layer, the width between the second diffusion layer and the first semiconductor region, the width of the second diffusion layer, and the width between the second diffusion layer and the second element formation region.

12. The device of claim 3, further comprising:

a first diffusion layer located in the semiconductor substrate and electrically connected to the first contacts;

a second diffusion layer located in the semiconductor substrate and electrically connected to the second contacts;

a first element formation region located in the first semiconductor region; and a second element formation region located in the second semiconductor region, wherein a width between the first element formation region and the second element formation region on a surface of the semiconductor substrate is smaller than a sum of a width between the first diffusion layer and the first element formation region, a width of the first diffusion layer, a width between the first diffusion layer and the second semiconductor region, a width between the second diffusion layer and the first semiconductor region, a width of the second diffusion layer, and a width between the second diffusion layer and the second element formation region.

13. The device of claim 12, wherein the width between the first element formation region and the second element formation region on a surface of the semiconductor substrate is equal to or smaller than a sum of the width between the first diffusion layer and the first element formation region, the width of the first diffusion layer, the width between the second diffusion layer and the first semiconductor region, the width of the second diffusion layer, and the width between the second diffusion layer and the second element formation region.

14. The device of claim 1, wherein a number of the second contacts is larger than that of the first contacts when the first conductivity type is an N-type and the second conductivity type is a P-type.

15. The device of claim 2, wherein a number of the second contacts is larger than that of the first contacts when the first conductivity type is an N-type and the second conductivity type is a P-type.

16. The device of claim 3, wherein a number of the second contacts is larger than that of the first contacts when the first conductivity type is an N-type and the second conductivity type is a P-type.

17. The device of claim 7, wherein a transistor of the first conductivity type and a transistor of the second conductivity type are used as sense amplifiers of a semiconductor storage device.

18. The device of claim 1, further comprising a wire located above the boundary.

19. The device of claim 18, wherein the wire has a concave-convex shape, a corrugated shape, or a zigzag shape along the boundary.

* * * * *